(12) United States Patent
Steffan et al.

(10) Patent No.: US 6,303,394 B1
(45) Date of Patent: Oct. 16, 2001

(54) GLOBAL CLUSTER PRE-CLASSIFICATION METHODOLOGY

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/186,052

(22) Filed: Nov. 3, 1998

(51) Int. Cl.$^7$ .......................... G01R 31/26; G06F 19/00; G01B 5/28; G01B 5/30
(52) U.S. Cl. .......................... 438/14; 700/110; 700/121; 702/35
(58) Field of Search ............................ 438/14; 700/110, 700/121; 702/35

(56) References Cited

U.S. PATENT DOCUMENTS

| | | | |
|---|---|---|---|
| 5,646,169 | * 7/1997 | Berezin et al. | 395/500 |
| 5,946,213 | * 8/1999 | Steffan et al. | 700/110 |
| 5,966,459 | * 10/1999 | Chen et al. | 382/149 |

\* cited by examiner

*Primary Examiner*—John F. Niebling
*Assistant Examiner*—Ron Pompey
(74) *Attorney, Agent, or Firm*—H. Donald Nelson

(57) ABSTRACT

A method of detecting and pre-classifying cluster type defects in a process for manufacturing semiconductor wafers. At least one inspection wafer is selected from a set of semiconductor wafers being process and the first layer of the set is processed. The first layer is scanned for defect information and it is determined whether a cluster pattern exists and comparing the cluster pattern to patterns stored in a pattern detection and classification register and pre-classifying the cluster pattern if a cluster pattern is detected and updating a defect database with comparison and pre-classification information for the first layer. Repeating the process for the next layer.

6 Claims, 2 Drawing Sheets

GLOBAL CLUSTER PRE-CLASSIFICATION METHODOLOGY

BACKGROUND OF THE INVENTION

1. Field of the Invention

This invention relates generally to a defect classification methodology in a semiconductor manufacturing system and more specifically, to a defect classification methodology in a semiconductor manufacturing system that determines if a cluster pattern exists on each layer and pre-classifies the cluster pattern if a cluster pattern is detected.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects during the manufacturing process. The number of good chips obtained from a wafer determines the yield. As can be appreciated, chips that must be discarded because of a defect increases the cost of the remaining usable chips.

A single semiconductor chip can require numerous process steps such as oxidation, etching, metallization and wet chemical cleaning. Some of these process steps involve placing the wafer on which the semiconductor chips are being manufactured into different tolls during the manufacturing process. The optmiszation of each of these process steps requires an understanding of a variety of chemical reactions and physical processes in order to produce high performance, high yield circuits. The ability to view and characterize the surface and interface layers of a semiconductor chip in terms of their morhology, chemical composition and distribution is an inavaiable aid to those involved in research and development, process, problem solving, and failur analysis of integrated circuits. A major part of the analysis process is to determine if defects are caused by one of the process tools, and if so, which tool caused the defects.

As the wafer is placed into different tools during the manufacturing process, each of the tools can produce different types of particles that drop onto the wafer and cause defects that have the potential to decrease the yield. In order to develop high yield semiconductor processes and to improve existing ones, it is important to identify the sources of the various particles that cause defects and then to prevent the tools from dropping these particles onto the wafer while the wafers are in the tools.

In order to be able to quickly resolve process or equipment issues in the manufacture of semiconductor products, a great deal of time, effort is being expended by semiconductor manufacturers to capture and classify silicon based defects. Once a defect is caught and properly described and classified, work can begin to resolve the cause of the defect and to eliminate the cause of the defect.

The standard procedure to capture and classify defects is to place a semiconductor wafer into a scanning tool after a selected process is finished. The scanning tool scans the surface of the semiconductor wafer and maps initial defect information to a register. The initial defect information mapped to a register includes position information. As is known in the semiconductor art, the number of defects can be large and to attempt to analyze each one of the defects would be time consuming and, in some cases, counterproductive. In order to decrease the time required to analyze defects, methods were developed to classify defects so that only one of a class of defects needed to be analyzed in order to determine the cause of all of the defects in a certain classification. Systems known as Automatic Defect Classification (ADC) systems were developed.

One such system for automatically classifying defects consists of the following methodological sequence. Gather a defect image from a review station. View the defect image and assign values to elemental descriptor terms called predicates that are general descriptors such as roundness, color, hue, graininess, etc. Assign a classification code to the defect based upon the values of all of the predicates. A typical ADC system can have 40 or more quantifiable qualities and properties that can be predicates. Each predicate can have a specified range of values and a typical predicate can have value assigned to for example, typically a value between 1 and 256. A value of 1 indicates that none of the value is present and a value of 256 indicates that the quality represented by the predicate is ideal. For example, a straight line would have a value of 1 for the predicate indicating roundness, whereas a perfect circle would have a value of 256 for the same predicate.

The classification code for each defect is determined by the system from the combination of all the predicate values assigned to the defect. The goal of the ADC system is to be able to uniquely describe all the defect types in such a manner that a single classification code can be assigned to a defect, which has been differentiated from all other defect types. The can be accomplished, for example, by a system administrator who trains an artificial intelligence system to recognize various combinations and permutations of the 40 or more predicates to assign the same classification code to the same type of defect. This would result in a highly significant statistical confidence in the probability that the defect, and all other defects of the same type or class, will always be assigned the same classification code by the ADC system. This is done by performing a "best-fit" calculation against all assigned classification codes. If the fit does not meet pre-assigned standards, the system will assign an "unknown" code, which means that the system needs further training for that device/layer/defect.

As should be appreciated, if there are a large number of defects, the process of assigning a classification code to each defect is time consuming and requires scanning and evaluation tools to be utilized to a great extent. Although most defects tend to be random point occurrences easily captured in a high field of view, occasionally defects occur over a relatively large area, which are caused by the same source. These defects can easily extend over an area of several die or even large portions of the wafer. The scan tool can easily identify these as cluster type defects, where a cluster is defined as a group of defects in which every defect within the cluster is within one radius of at least one other defect in the cluster. These cluster type defects tend to fall within certain categories, including, for example, scratch, hot spot, comet tail, under etch patch, leak spray pattern, splattering, incomplete strip, and wafer edge exclusion (WEE) flaking.

Since the scan tool, or defect management system has all the information necessary to generate maps of defects, including these global patterns, it would be very beneficial to have the system pre-classify these clusters based upon an acquired knowledge base. For example, a long, narrow string of defects in a straight or slightly curved line might be called a scratch, a large round cluster of defects might be called a hot spot, and a large found cluster of defects, which tapers into a point might be called a comet tail. The advantages of such a system that pre-classifies defects as cluster defects would be to save personnel and equipment time in that not all defects would have to be analyzed because the presumption would be that all defects in a cluster would be caused by the same source and therefore not all of the defects would need to be analyzed.

Therefore, what is needed is a system that has the ability to analyze defect maps and pre-classify clusters of defects based on factors such as shape, appearance, location on the wafer in relation to other defects, and size. The system would work in conjunction with an existing defect management system such that the pre-classification data would be written back to the defect database as pre-classified data where it could be used in further evaluation analysis, such as pareto charts, trend analysis, and various types of equipment monitoring such as preventative maintenance scheduling.

SUMMARY OF THE INVENTION

The present invention is directed to a method of detecting and pre-classifying cluster type defects in a process for manufacturing semiconductor wafers. A wafer is selected from a set of semiconductor wafers in a production lot. The first layer of the set of semiconductor wafers is processed and scanned for defect information and it is determined whether a cluster pattern exists. The defect information is compared to patterns stored in a pattern detection and classification register. The cluster pattern is preclassified if a cluster pattern is detected. A defect database is updated with comparison and pre-classification information.

In accordance with one aspect of the invention, the defect database is updated by a defect management system.

In accordance with another aspect of the invention, the set of production wafers is subjected to a next process and the next layer is scanned to determine if a cluster defect pattern exists.

The described method provides a method of detecting and pre-classifying cluster defect patterns.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention that which illustrates the best mode presently contemplated by the inventors for practicing the invention.

Figure 1:
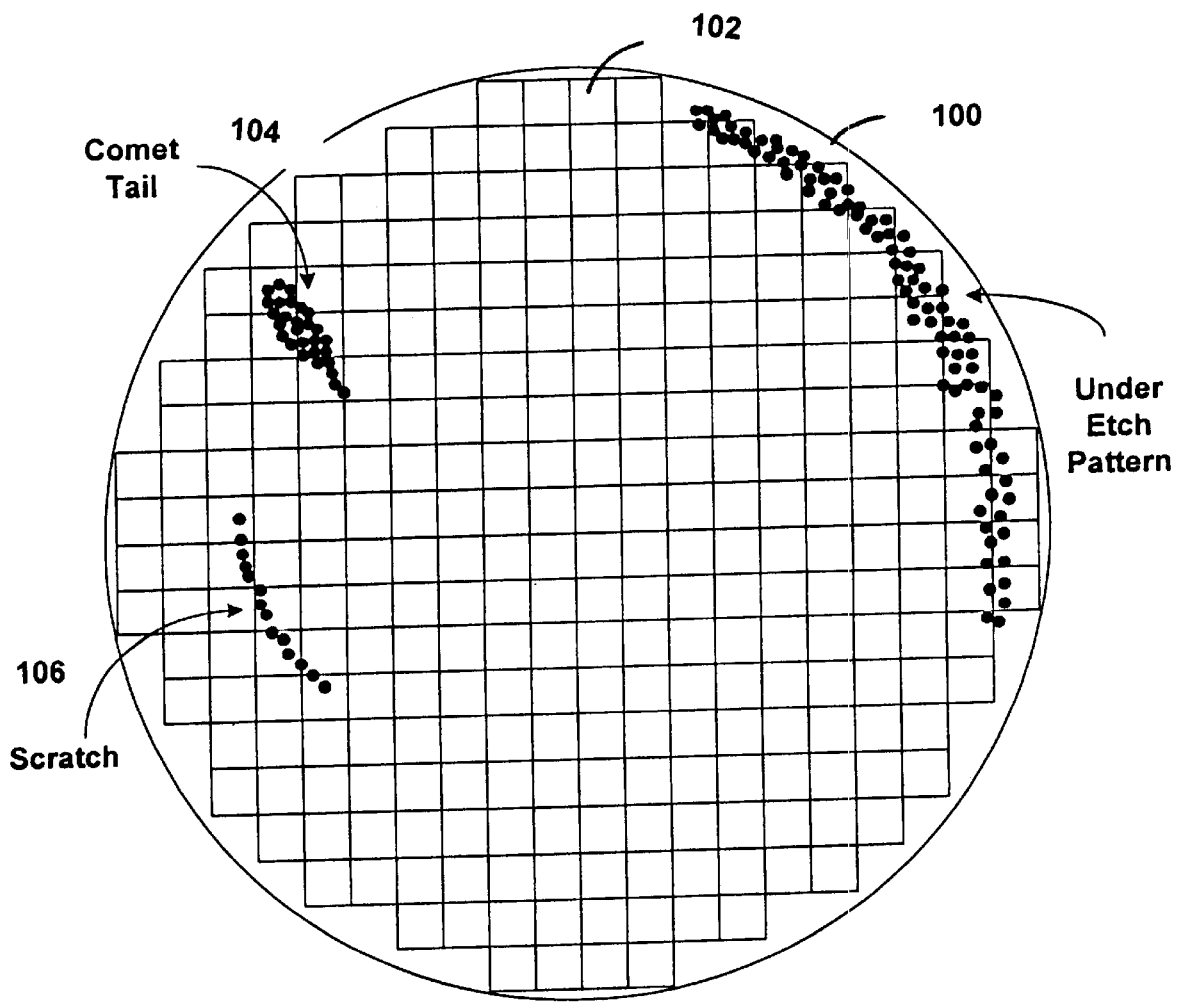
FIG. 1 shows a semiconductor wafer with die that would be formed on the wafer and three types of clusters, a scratch, a comet tail, and an under etch pattern, that could be found on the wafer.

FIG. 1 shows a semiconductor wafer 100 with individual die, such as the die indicated at 102. Three cluster defect types are shown, a first cluster defect type known as a comet tail is shown at 104, a second cluster defect type known as a scratch is shown at 106, and a third cluster defect type known as an under etch pattern is shown at 108.

Figure 2:
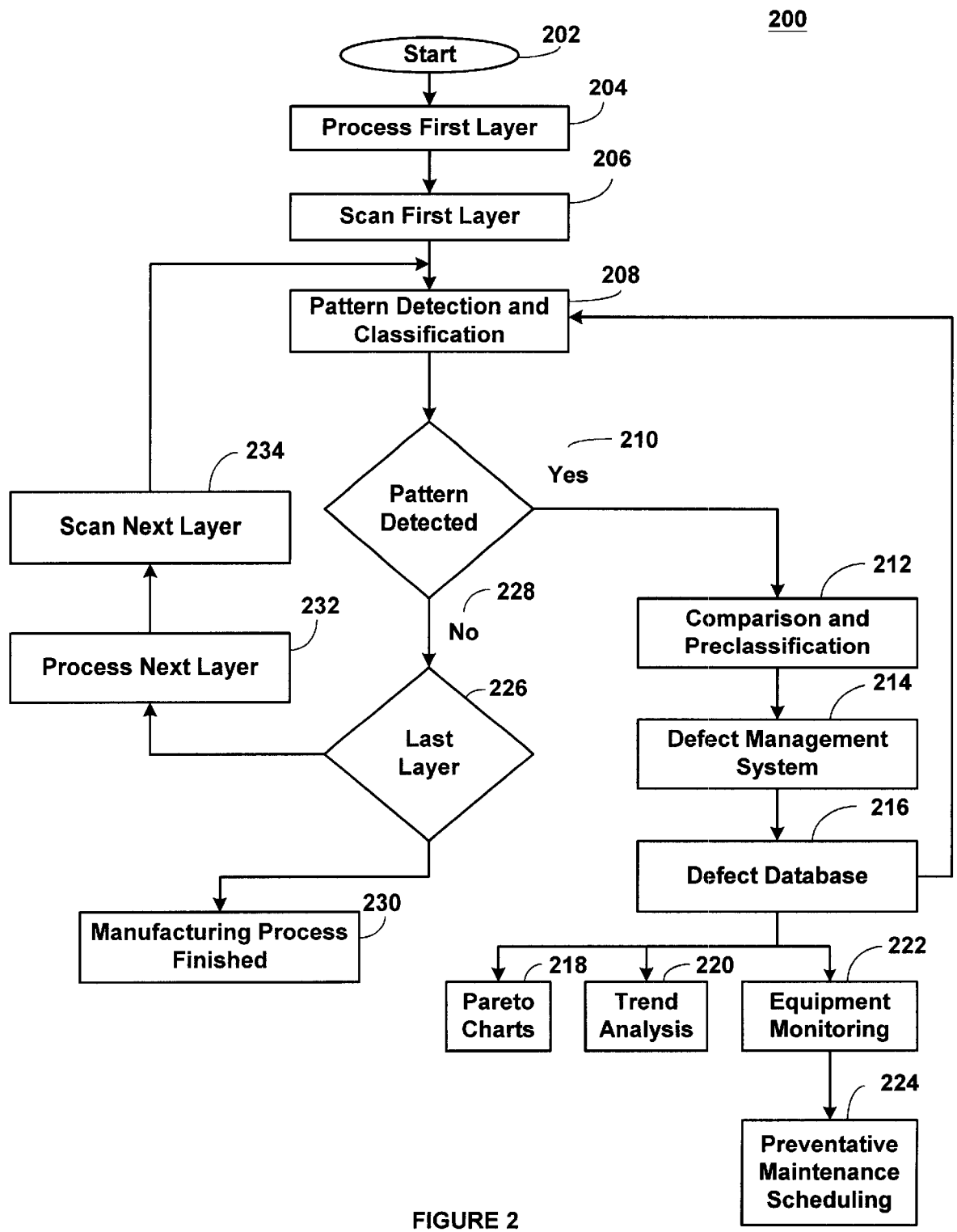
FIG. 2 is a flow diagram of a manufacturing process, including the pattern detection and classification of cluster defects in accordance with the present invention.

FIG. 2 is a flow diagram of a manufacturing process 200 that includes the pattern detection and classification of cluster defects in accordance with the present invention. The manufacturing process starts at 202 with a number of semiconductor wafers placed in a manufacturing cassette (not shown). Typically, approximately 25 semiconductor wafers are in a manufacturing cassette and one or two of the semiconductor wafers are selected to be inspection wafers and are scanned throughout the manufacturing process after processes that are designated to be inspected. It should be appreciated that the inspection wafers are not scanned after every process. Some of the processes do not typically cause defects and the inspection wafers are not scanned after such processes. All of the semiconductor wafers are sent through the first process at 204. The selected inspection wafers are scanned for defects at 206. The defect data is subjected to a pattern detection and classification process at 208. If there is a pattern detected as indicated at 210, the information is sent to a comparison and pre-classification register 212 and then to a defect management system 214. The defect management system 214 stores the defect information or updates the defect information in database at 216, which is in communication with the pattern detection and classification register at 208. The defect information in the defect database 216 is used to construct pareto charts 218, perform trend analyses at 220, monitor equipment at 222 to determine factors such as preventative maintenance scheduling at 224. After the defect database 216 updates the pattern detection and classification register at 208, it is determined at 226 if the layer on the semiconductor wafer just processed is the last layer to be processed. Similarly, if no pattern was detected as indicated at 228, it is determined at 226 if the layer on the semiconductor wafer just processed is the last layer to be processed. If the layer just processed is the last layer the manufacturing process is finished as indicated at 230. If the layer just processed is not the last layer, all of the semiconductor wafers are subjected to the next process as indicated at 232. After the next process is completed, the selected inspection wafers are scanned as indicated at 234 and the process as discussed above is repeated until it is determined at 226 that the last layer has been processed.

The advantages of the present invention are:

1. All cluster type defects can be pre-classified and removed from the random defect population for defect sample plan preparation.

2. More accurate pareto information of wafer level defects will be obtained.

3. No additional overhead for greatly enhanced defect data.

4. The removal of the cluster type defects saves personnel and equipment time.

5. The removal of the cluster type defects allows additional random defect examination and analysis for the same personnel and equipment time.

6. The additional random defect examination and analysis provides increased yield due to improved analysis.

In summary, the results and advantages of the present invention can now be more fully realized. The method of detecting and pre-classifying cluster type defects in a process for manufacturing semiconductor wafers provides advantages in the manufacturing process that improves the efficiency of the manufacturing process and increases the yield.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of detecting and pre-classifying cluster type defects in a process for manufacturing semmiconductor wafers, the method comprising:

selecting at least one examination semiconductor wafers being manufactured;

subjecting the set of semiconductors wafers to a first layer process;

scanning the first layer for defect information;

determining if a cluster pattern exists in the first layer process by comparing defects detected in the first layer process to patterns stored in a pattern detection and classification register and pre-classifying the cluster pattern if a cluster pattern if a cluster pattern is detected; and updating a defect database with comparison and pre-classification information for the first layer.

2. The method of claim 1 wherein the comparison and pre-classification information for the first layer updates the patterns stored in the pattern detection and classification register for the first layer.

3. The method of claim 2 wherein updating the defect database is accomplished by a defect management system.

4. The method of claim 3 wherein the set of semiconductor wafers is subjected to a next process if the process just completed is not the last layer to be processed.

5. The method of claim 4 wherein:

the next layer of the at least one inspection wafer is scanned for defect information;

determining if a cluster pattern exists in the next layer process by comparing defects detected in the next layer process to patterns stored in a pattern detection and classification register and pre-classifing the cluster pattern if a cluster pattern is detected; and updating the defect database with comparison and pre-classification information for the next year.

6. The method of claim 5 wherein the comparison and pre-classification information for the next layer updates the patterns stored in the pattern detection classification register for the next layer.

* * * * *